(12) United States Patent
Notomi et al.

(10) Patent No.: US 10,306,744 B2
(45) Date of Patent: May 28, 2019

(54) PLASMA GENERATION APPARATUS AND HIGH-FREQUENCY POWER SOURCE

(71) Applicant: DAIHEN Corporation, Osaka-shi, Osaka (JP)

(72) Inventors: Hayato Notomi, Osaka (JP); Shigeki Amadatsu, Osaka (JP); Eiji Tatebe, Osaka (JP); Michio Taniguchi, Osaka (JP)

(73) Assignee: DAIHEN Corporation, Osaka (JP)

( * ) Notice: Subject to any disclaimer, the term of this patent is extended or adjusted under 35 U.S.C. 154(b) by 0 days.

(21) Appl. No.: 15/710,086

(22) Filed: Sep. 20, 2017

(65) Prior Publication Data

US 2018/0092196 A1    Mar. 29, 2018

(30) Foreign Application Priority Data

Sep. 23, 2016  (JP) .................................. 2016-185115

(51) Int. Cl.
 *H05H 1/46*  (2006.01)
 *H01J 37/32*  (2006.01)

(52) U.S. Cl.
CPC ............ *H05H 1/46* (2013.01); *H01J 37/321* (2013.01); *H01J 37/3244* (2013.01); *H01J 37/3266* (2013.01); *H01J 37/32174* (2013.01); *H05H 2001/4675* (2013.01)

(58) Field of Classification Search
CPC ............ H01J 37/32174; H01J 37/3266; H01J 37/321; H01J 37/3244; H01J 2237/327; H01J 37/32339; H01J 37/32467; H01J 37/32458; H01J 37/32513; H05H 1/46; H05H 2001/4645; H05H 2001/4652; H05H 2001/4675; H05H 2001/4682
See application file for complete search history.

(56) References Cited

U.S. PATENT DOCUMENTS

| | | | |
|---|---|---|---|
| 6,150,628 A | 11/2000 | Smith et al. | |
| 6,531,031 B1 * | 3/2003 | Becker | H01J 37/321 118/723 AN |
| 6,855,906 B2 * | 2/2005 | Brailove | H05B 6/108 156/345.48 |
| 8,853,948 B2 * | 10/2014 | Choi | H05H 1/46 315/111.21 |
| 8,866,390 B2 * | 10/2014 | Choi | H05H 1/46 315/111.01 |
| 9,349,575 B2 * | 5/2016 | Choi | H01J 37/32935 |
| 2017/0062183 A1 * | 3/2017 | Taniguchi | H01J 37/321 |

FOREIGN PATENT DOCUMENTS

JP        4070152 B2    1/2008

* cited by examiner

*Primary Examiner* — Haissa Philogene
(74) *Attorney, Agent, or Firm* — Hamre, Schumann, Mueller & Larson, P.C.

(57) ABSTRACT

A plasma generation apparatus includes a chamber, a high-frequency power source, a magnetic field generator and a parallel capacitor. The chamber has an inner, toroidal-shaped electric discharge space. The high-frequency power source outputs a high-frequency current to the magnetic field generator, which generates a high-frequency magnetic field upon flowing of the high-frequency current therethrough. The parallel capacitor is connected in parallel to the magnetic field generator.

12 Claims, 8 Drawing Sheets

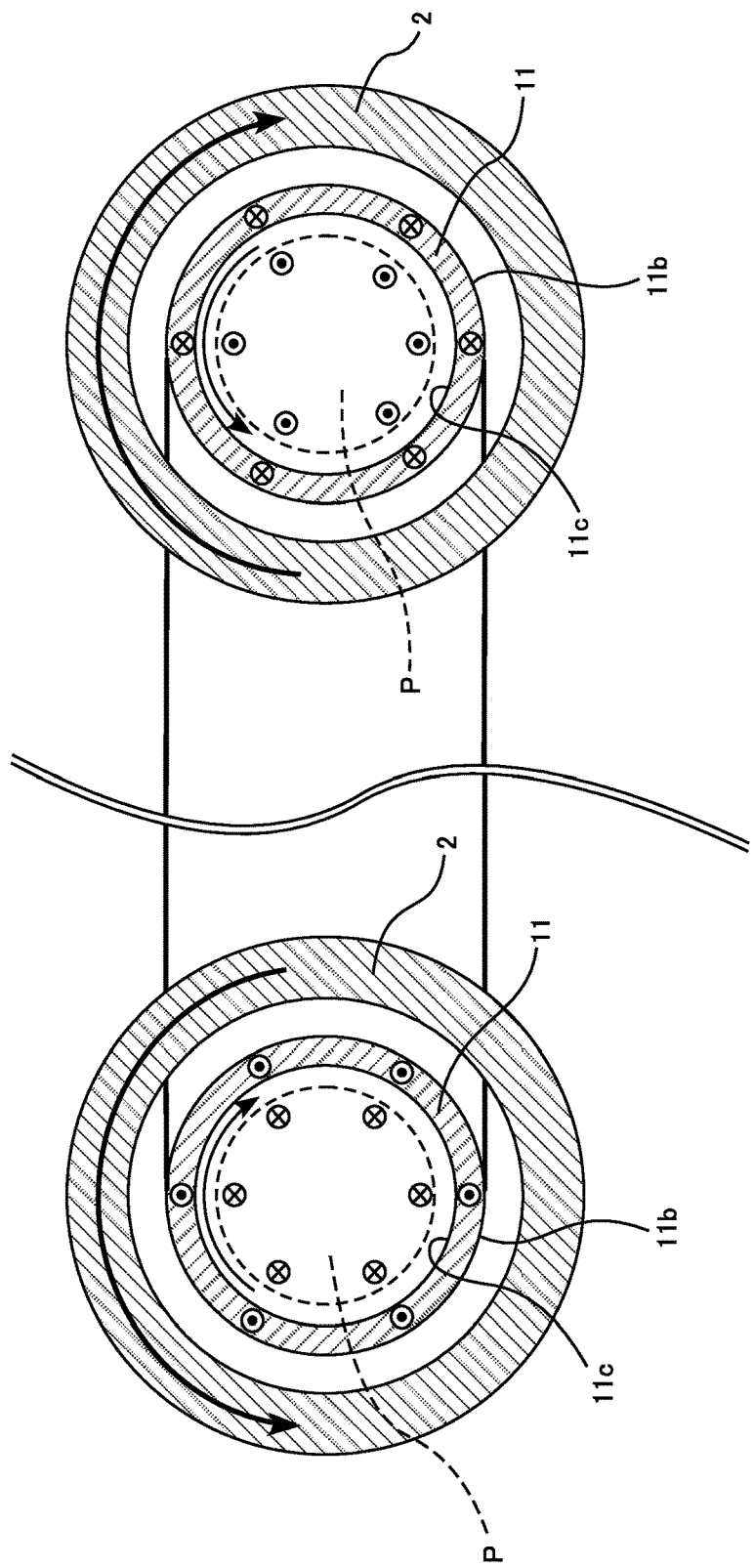

PLASMA GENERATION APPARATUS AND HIGH-FREQUENCY POWER SOURCE

FIELD

The present disclosure relates to a plasma generation apparatus for generating a toroidal plasma. The disclosure also relates to a high-frequency or radio frequency power source.

BACKGROUND

There are conventionally-known apparatuses configured to produce a plasma used for conducting thin film formation process or etching process. Types of plasma apparatuses include an electric field-coupling plasma generation apparatus and an inductive-coupling plasma generation apparatus. The former apparatus utilizing electric field coupling applies a high-frequency electric field to the material gas contained in a chamber via electrodes for producing a plasma of the material gas. The other type of apparatus, utilizing inductive coupling, generates a high-frequency magnetic field by a high-frequency current flowing in an induction coil, and the resulting magnetic field in turn generates a high-frequency electric field in the chamber for producing a plasma.

Japanese Patent No. 4070152 discloses an inductive-coupling plasma generation apparatus for a toroidal plasma, while also disclosing methods of supplying energy needed to produce a plasma (i.e., ignite a plasma), such as utilizing ultraviolet irradiation to generate free electric charges, or applying high-voltage electric pulses directly to an inductive coil, or applying high-voltage electric pulses to electrodes provided in a chamber.

The above-noted methods using ultraviolet irradiation or using electrodes in the chamber, however, require designing a new chamber (or modifying the existing chamber) for implementing the particular method. Thus, these methods tend to result in a longer development period. In addition, these methods are not cost-effective because they need a special structure used only for a very short period of time, i.e., at the time of igniting a plasma. In contrast, the method of applying high-voltage pulses to the existing inductive coil does not require any addition of components. However, generating a high-frequency electric field requires high electric power. Unfavorably, a high current flowing through a high-frequency power source circuit to provide the required power may damage the conventional power source circuit.

SUMMARY

The present disclosure has been proposed in view of the above circumstances. It is therefore an object of the disclosure to provide a plasma generation apparatus that does not need high electric power in generating a high-frequency electric field to ignite a plasma.

According to an aspect of the present disclosure, there is provided a plasma generation apparatus including: a chamber having a toroidal-shaped electric discharge space; a high-frequency power source that outputs a high-frequency current; a magnetic field generator that generates a high-frequency magnetic field upon flowing of the high-frequency current therethrough; and a parallel capacitor connected in parallel to the magnetic field generator.

With the above apparatus, since there is a capacitor ("parallel capacitor") connected in parallel to the magnetic field generator, the impedance of the load viewed from the high-frequency power source is high. The high impedance makes it possible to apply high voltage to the magnetic field generator even when the output power of the high-frequency power source is low. Upon receiving the high voltage, the magnetic field generator can generate a sufficient high-frequency magnetic field, which produces a sufficient high-frequency electric field in the chamber. In this manner, according to the plasma generation apparatus, a proper high-frequency electric field necessary for plasma ignition can be generated by low electric power.

In an embodiment, the capacitance of the parallel capacitor may be set based on (in accordance with, depending on, etc.) the self-inductance of the magnetic field generator. Accordingly, the impedance of the load viewed from the high-frequency power source can be set to have an appropriate value.

In an embodiment, the capacitance of the parallel capacitor may be equal to $1/(\omega^2 L)$, where L is the self-inductance of the magnetic field generator and $\omega$ is an angular frequency of the high-frequency current. In this case, the magnetic field generator and the parallel capacitor provide a parallel resonance circuit, whereby the impedance of the load viewed from the high-frequency power source can be maximized.

In an embodiment, the parallel capacitor may be disposed between the high-frequency power source and the magnetic field generator, so that the parallel capacitor is a separate component from the high-frequency power source. Accordingly, use may be made of a commercially available, general-purpose high-frequency power source for the plasma generation apparatus.

In an embodiment, the parallel capacitor may be disposed inside the high-frequency power source. In this case, by simply connecting the high-frequency power source to the magnetic field generator, the parallel capacitor can be properly connected to the magnetic field generator.

In an embodiment, the chamber may be made of an electroconductive material, while also be provided with an insulating portion for achieving insulation in the toroidal direction of the chamber. With these arrangements, the chamber itself can be used as a part of the electric current route for current to be supplied from the power source. Also, with the insulating portion intervening in the toroidal direction of the chamber, it is possible to prevent an inductive current from flowing through the chamber in the toroidal direction. In an embodiment, the chamber may be made of a metal.

In an embodiment, the insulating portion may be provided by a gap via which a first end and a second end of the chamber are arranged to face each other.

In an embodiment, the plasma generation apparatus or more specifically the insulating portion may further include a tubular connection adapter for defining the size (or distance) of the gap in the toroidal direction. To this end, the chamber may be formed with two flanges spaced apart from each other with the gap or the connection adapter intervening therebetween, so that the connection adapter is disposed between the two flanges.

In an embodiment, the plasma generation apparatus may further include at least one elastic ring held in close contact with the inner surface of the connection adapter and the outer surface of the chamber for serving as an hermetic seal.

In an embodiment, the plasma generation apparatus may further include a magnetic core arranged to surround a tubular portion of the chamber.

In an embodiment, the chamber itself may function as the magnetic field generator.

In an embodiment, the plasma generation apparatus may further include a series capacitor different from the above-mentioned parallel capacitor. In this case, the chamber may be provided with an additional insulating portion for insulation in the toroidal direction, and the series capacitor may be connected to the chamber in a manner such that the series capacitor bridges the additional insulating portion.

In an embodiment, the series capacitor may have a reactance that is substantially one half of the reactance of the magnetic field generator after generation of plasma.

In an embodiment, the magnetic field generator may include an inductive coil wound around the magnetic core.

According to a second aspect of the present disclosure, there is provided a high-frequency power source for outputting a high-frequency current to a magnetic field generator that generates a high-frequency magnetic field for generating a high-frequency electric field in a toroidal-shaped electric discharge space. The high-frequency power source includes two output terminals and a parallel capacitor connected in parallel between the two output terminals. Further, the parallel capacitor has a capacitance that is set based on the self-inductance of the magnetic field generator.

According to the present disclosure, the parallel capacitor, connected in parallel to the magnetic field generator, ensures that the impedance of the load viewed from the high-frequency power source is advantageously high. The high impedance makes it possible to apply high voltage to the magnetic field generator even if the output power of the high-frequency power source is low. By the high voltage applied, the magnetic field generator can generate a sufficient high-frequency magnetic field, and can thereby generate a required high-frequency electric field in the chamber. Accordingly, a sufficient high-frequency electric field necessary for plasma ignition can be generated at low electric power.

DRAWINGS

FIG. 4 is a sectional view taken along line IV-IV in FIG. 2B;

DETAILED DESCRIPTION

Preferred embodiments of the present disclosure will be described below with reference to the accompanying drawings.

Figure 1A:
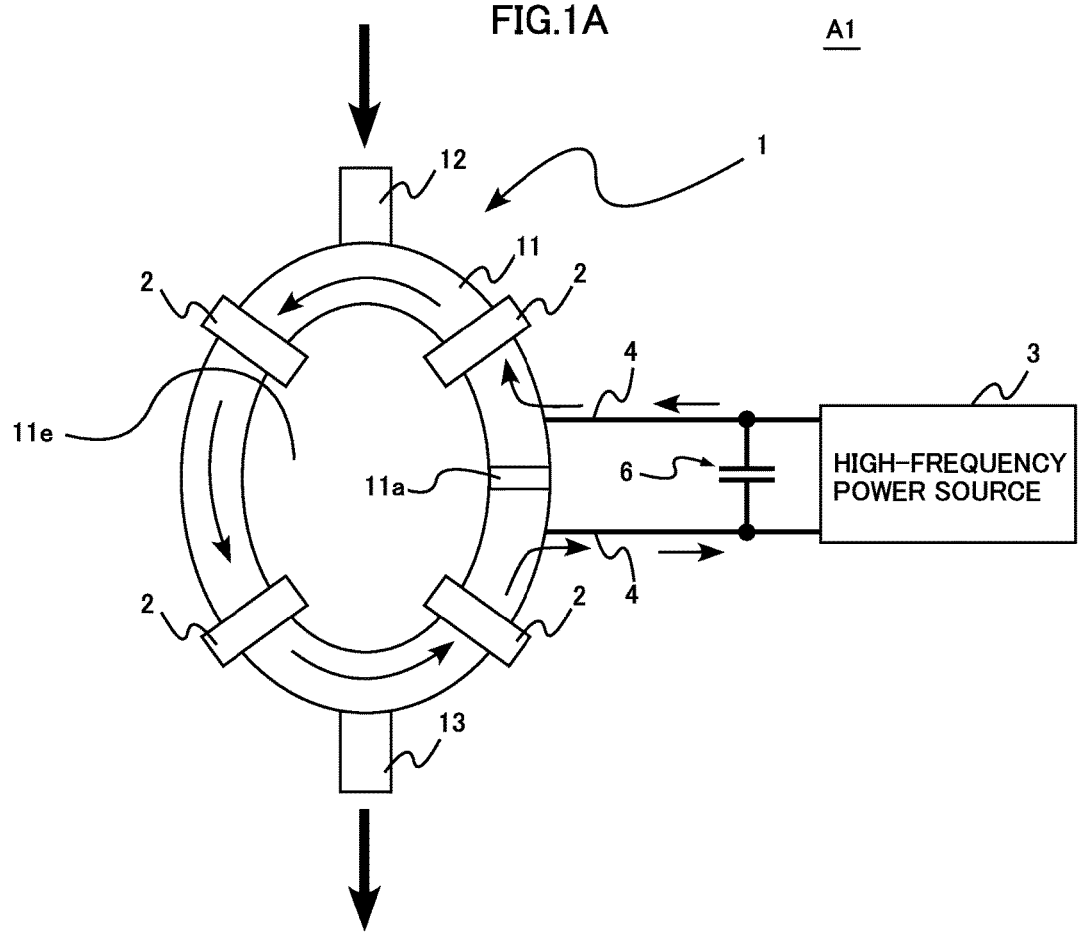
FIG. 1A is a schematic diagram illustrating a plasma generation apparatus according to a first embodiment.

FIGS. 1A to 4 illustrate a plasma generation apparatus A1 according to a first embodiment. FIG. 1A is a schematic diagram showing the entirety of the plasma generation apparatus A1. FIG. 1B depicts an equivalent circuit of the plasma generation apparatus A1. FIGS. 2A and 2B illustrate a chamber used for the plasma generation apparatus A1. FIG. 2A is an external perspective view of the chamber, and FIG. 2B is a sectional view taken along line II-II in FIG. 2A. FIGS. 3A and 3B illustrate an insulating gap provided in the chamber, and a connection adapter used for defining the size or distance of the insulating gap. FIG. 3A is a sectional enlarged view showing the portion surrounded by broken line III in FIG. 2B. FIG. 3B is an exploded view showing the portion. FIG. 4 is a sectional view taken along line IV-IV in FIG. 2B.

Figure 1B:
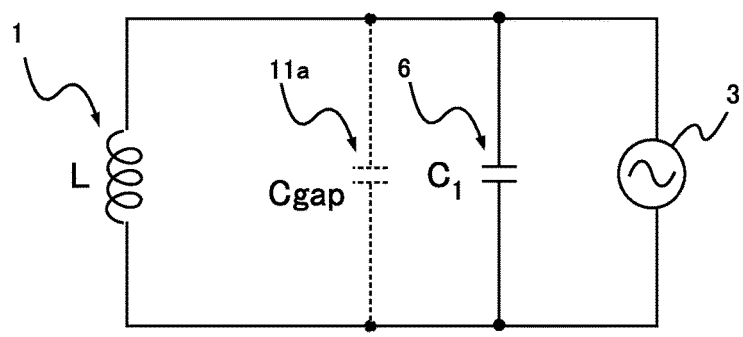
FIG. 1B is an equivalent circuit diagram of the plasma generation apparatus according to the first embodiment.

The plasma generation apparatus A1 is an inductive-coupling type configured to generate a high-frequency electric field in a toroidal-shaped electric discharge space using electromagnetic inductance. The resulting electric field turns a material gas in the electric discharge space into a plasma, toroidally contained in the chamber. The plasma generation apparatus A1 produces a plasma of the material gas to be used as a reactive gas, and discharges the plasmatic gas to a plasma processing step, such as thin film formation processing or etching processing. As shown in FIGS. 1A and 1B, the plasma generation apparatus A1 includes a chamber 1, magnetic cores 2, a high-frequency power source 3, connection lines 4, and a parallel capacitor 6.

Figure 2A:
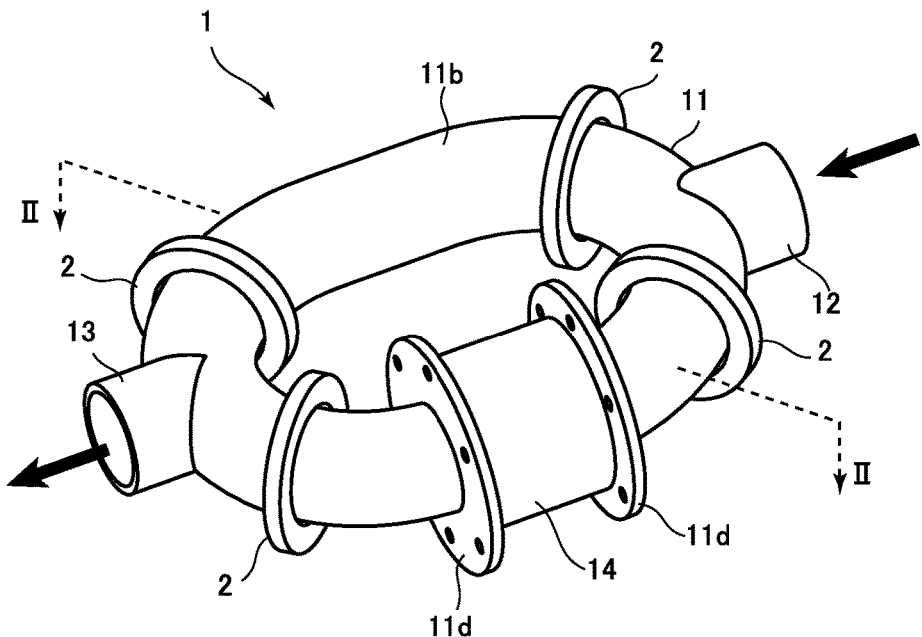
FIG. 2A is a perspective view illustrating a chamber of the plasma generation apparatus.
Figure 2B:
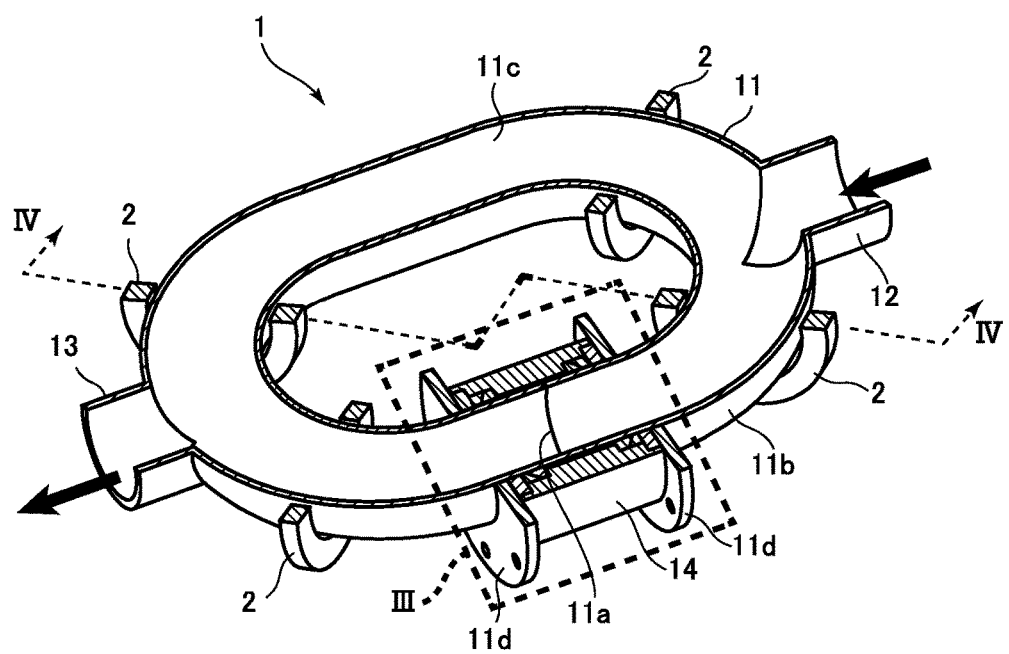
FIG. 2B is a sectional view along line II-II in FIG. 2A.

The chamber 1 has an electric discharge space of a toroidal shape and generates a toroidal plasma. As shown in FIGS. 2A and 2B, the chamber 1 includes a main body 11 of a toroidal shape. In the illustrated example, the main body 11 is oval or elongated in one direction in plan view, and may be provided by or constituted as a pipe with a substantially circular cross section (orthogonal to the axis of the pipe). As described in detail below, the main body 11 has two opposed ends that are slightly spaced apart from each other in the longitudinal direction of the pipe via an intervening gap. The chamber 1 includes an inlet port 12, which is an opening for introducing the material gas into the main body 11, and an outlet port 13, which is an opening for discharging the reactive gas (plasma gas) from the main body 11. In the present embodiment, without limitation, the inlet port 12 and the outlet port 13 are positioned exactly opposite to each other in the circumferential direction of the main body 11, so that the two routes through which the material gas flows have the same lengths. The chamber 1 may be made of a metal such as aluminum, though the present disclosure is not limited to this, and another metal such as copper or iron may be used. Also, use may be made of other kinds of material (e.g. non-metal material) as long as they have required mechanical strength and permit the passage of electric current to the required extent. For example, use may be made of a superconducting ceramic or carbon as an alternative material. In an embodiment, the cross section of the main body 11 of the chamber 1 is not limited to a circular shape, but may be an oval shape, an elliptical shape, or a polygonal shape (such as a quadrangular shape).

Figure 3A:
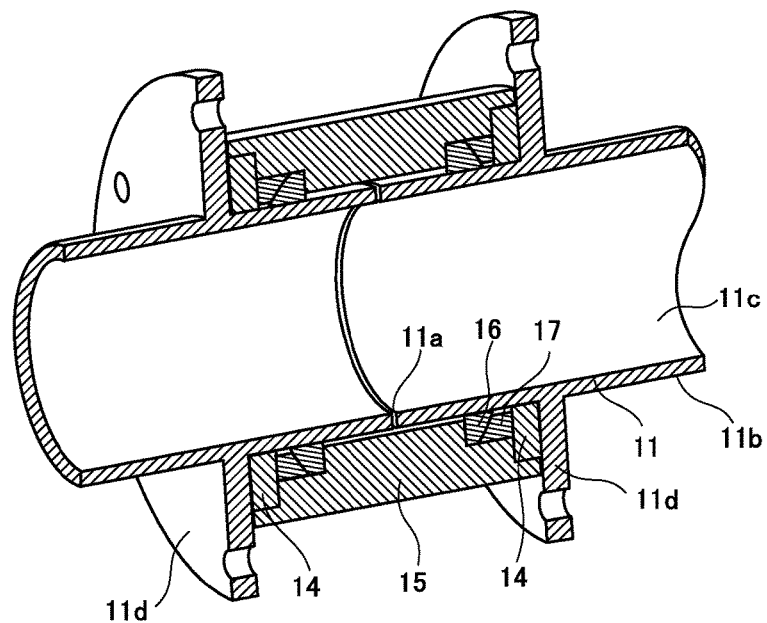
FIG. 3A is a sectional view illustrating the portion surrounded by broken line III in FIG. 2B.
Figure 3B:
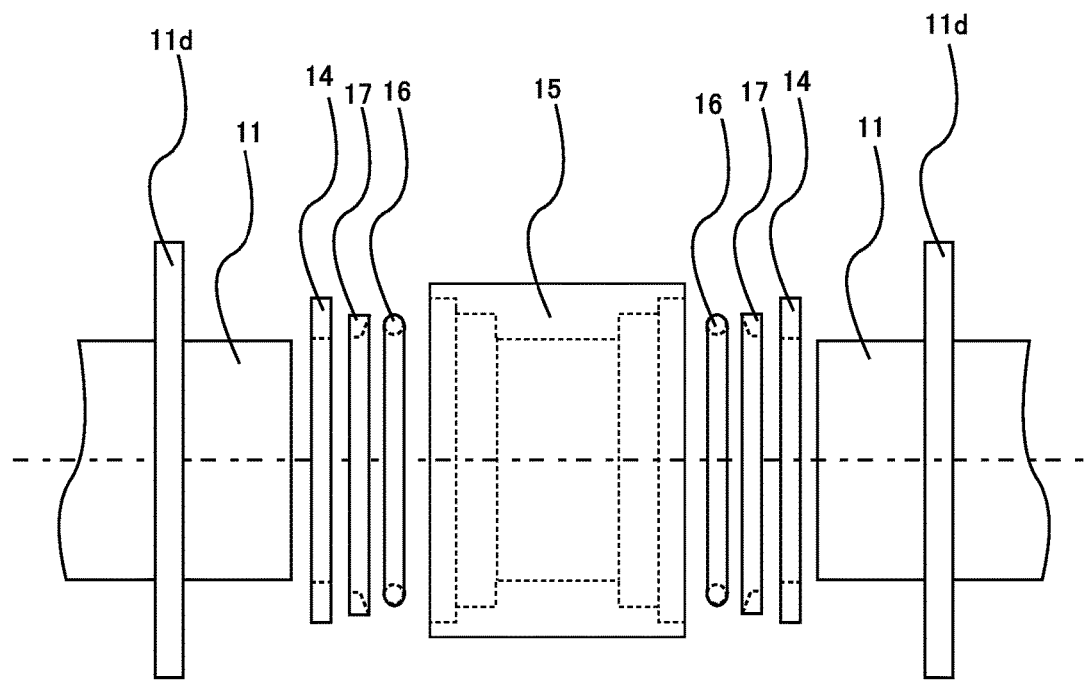
FIG. 3B is an exploded view illustrating the portion surrounded by broken line III in FIG. 2B.

The main body 11 of the chamber 1 is provided with an insulating gap 11a (see FIGS. 1A-1B and 3A-3B) that breaks the continuity of the chamber 1 at a position along the toroidal direction. In the illustrated example, without limitation, the gap 11a is a simple interval filled with air. As illustrated in FIGS. 3A and 3B, the size or distance of the insulating gap 11a is maintained or defined by two flanges 11d, insulating spacers 14 and a connection adapter 15. The two flanges 11d are provided on an outer wall surface 11b of the main body 11 and electrically connected to the main body 11. The insulating spacers 14 and the connection adapter 15 are provided between the two flanges 11d. In this manner, the mutually facing but separated portions of the main body 11 are electrically insulated from each other, with the insulating gap 11a present therebetween.

The insulating spacers 14 are insulating ceramic rings, for example, and are arranged such that the separated portions of the main body 11 of the chamber 1 are inserted therein and that the insulating spacers 14 come into contact with the flanges 11d. The insulating spacers 14 prevent the main body 11 and the connection adapter 15 from coming into contact with each other to thereby electrically insulate the main body 11 and the connection adapter 15. Two insulating spacers 14 are respectively arranged on two separated portions of the main body 11. The insulating spacers 14 may be made of any suitable material and not particularly limited to a particular one, as long as the material is sufficiently rigid so that an insulating space is formed between the main body 11 and the connection adapter 15.

The connection adapter 15 aligns the separated portions of the main body 11 to each other, while keeping the separated portions from coming close to each other beyond the predetermined limit, thereby defining the distance of the insulating gap 11a. The connection adapter 15 is, for example, a cylinder made of aluminum and having a stepped inner surface. The separated portions of the main body 11 are inserted from both sides of the connection adapter 15, and the flanges 11d on both sides are fixed to each other by bolts and nuts, for example. The distance between the two flanges 11b is defined by the connection adapter 15 together with the two insulating spacers 14, and the separated portions of the main body 11 are fixed with a predetermined gap therebetween.

Also, in order to hermetically seal the main body 11 of the chamber 1, O-rings 16 and O-ring pressure rings (simply "pressure rings") 17 are provided between the connection adapter 15 and the insulating spacer 14.

The O-rings 16 are made of fluorine-based rubber, for example. Each O-ring 16 is arranged between the insulating spacer 14 and the connection adapter 15, with the corresponding one of the separated portions of the main body 11 is inserted into the O-ring 16. The O-rings 16 can deform to come into close contact with the inner surface of the connection adapter 15 and the outer wall surface 11b of the main body 11, so as to keep the main body 11 hermetically sealed. The O-rings 16 may be made of any suitable insulating material as long as the resulting rings are elastic and can serve as hermetic seals between the inner surface of the connection adapter 15 and the outer wall surface 11b of the main body 11. Preferably, use may be made of a material that is chemically stable and has high thermal resistance.

The pressure rings 17 are made of Teflon (registered trademark), for example. Each pressure ring 17 is arranged between the relevant insulating spacer 14 and O-ring 16, with one of the separated portions of the main body 11 inserted therein. Each pressure ring 17 has a slope on the inner circumference surface facing the O-ring 16, and the inner diameter of the slope (hence the pressure ring 17) becomes larger as proceeding toward the O-ring 16. Each pressure ring 17 applies pressure to the corresponding O-ring 16 via the slope. Accordingly, the pressed O-ring 16 deforms and come into closer contact with the connection adapter 15 and the main body 11. The pressure rings 17 may be made of any suitable material as long as the resulting rings 17 are rigid enough to properly press the O-rings 16. Preferably, the pressure rings 17 may be made of a material that is chemically stable and has high thermal resistance. Also, in an embodiment, each ring 17 may have no such slope as the one mentioned above, as long as the ring 17 can press the O-ring 16 properly even without a slope.

In the above embodiment, one O-ring 16 and one pressure ring 17 are used for each separated portion of the main body 11. The number and configuration of the respective rings 16, 17 are not limited to those of the above embodiment. For instance, each separated portion of the main body 11 may be provided with two (or more) O-rings 16 and two (or more) pressure rings 17 arranged alternately with the O-rings 16 along the axis of the separated portion of the main body 11. If the main body 11 can be hermetically sealed using only the O-rings 16, no pressure ring 17 may be used. Further, for protection of each O-ring 16 from the reactive gas to be generated in the chamber 1, a highly resistant member (or substance, etc.) to the reactive gas may be provided between the insulating gap 11a and the O-ring 16 for sealing the O-ring 16 from the reactive gas. It is preferable, as in the embodiment depicted in FIG. 3A, that each O-ring 16 (hence the accompanying pressure ring 17) may be sufficiently spaced apart from the insulating gap 11a, so that the O-ring 16 is less likely to be exposed to the reactive gas.

In the present embodiment, the insulating gap 11a is approximately several millimeters wide (e.g. at least 2 or 3 mm wide). Although a larger insulating gap 11a is advantageous to achieving insulation along the toroidal direction, the reactive gas may readily leak via the gap 11a and eventually deteriorate the O-rings 16 and pressure rings 17. Hence, the insulating gap 11a may preferably be as small as possible to the extent that the electrical insulation does not fail. In the present embodiment, the size or width of the insulating gap 11a can be adjusted by the connection adapter 15 of a predetermined length (i.e., the dimension measured in the axis direction). Hence, the size of the insulating gap 11a can be changed simply by replacing the connection adapter 15 with another connection adapter 15 of a required length.

Means to ensure the insulating gap 11a is not limited to the above. In the present embodiment, the connection adapter 15 is made of a metal (e.g., aluminum), and thus the insulating spacers 14 are provided to prevent contact between the connection adapter 15 and the main body 11. However, when the connection adapter 15 is made of an insulating material, the insulating spacers 14 may not be needed. Further, different means may be employed as long as the insulating gap 11a is maintained and the main body 11 is hermetically sealed. For instance, use may be made of an insulating resin or other suitable substance that is resistant to the reactive gas, and the insulating gap 11a may be completely filled with such a resin or substance. Preferably, this resin or substance may be rigid (at least when solidified) enough to mechanically connect the separated portions of the main body 11 to each other.

The magnetic cores 2 are made of a ferromagnetic material and have a toroidal shape. In the illustrated example, use is made of four round magnetic cores 2 each surrounding a tubular portion of the main body 11 (or, the main body 11 extends through the respective magnetic cores 2). Each magnetic core 2 may be configured to have a different shape, such as a polygonal shape having three, or four, or more sides.

The high-frequency power source 3 outputs high-frequency power. Specifically, the high-frequency power source 3 may include a rectifying circuit and an inverter circuit, where the rectifying circuit converts AC power supplied from a power system (e.g., the mains or electrical grid) into DC power, and the inverter circuit converts the DC power into high-frequency power. Then, the converted high-frequency power is outputted from the power source 3. Further, the high-frequency power source 3 may include a control circuit for controlling the output power and/or output current. In the present embodiment, without limitation, the high-frequency power source 3 outputs high-frequency power of 13.56 MHz, for example.

The connection lines 4 connect the high-frequency power source 3 and the chamber 1. One connection line 4 may be connected to one output terminal of the high-frequency power source 3 and to one flange 11d of the chamber 1. The other connection line 4 may be connected to the other output terminal of the high-frequency power source 3 and to the other flange 11d of the chamber 1. Instead, each connection line 4 may be connected, at one end, directly to the outer wall surface 11b of the main body 11, not to the flange 11d. The main body 11 of the chamber 1 between the two flanges 11d is electrically insulated due to the presence of the insulating gap 11a. Accordingly, a current route is formed, as indicated by the arrows in FIG. 1A, and a high-frequency current outputted from the high-frequency power source 3 will flow in the main body 11 of the chamber 1 along the toroidal direction. In this embodiment, the chamber 1 (or the main body 11) functions as a coil to generates a high-frequency magnetic field that passes through the opening or hole 11e of the toroidal-shaped main body 11.

The parallel capacitor 6 is a capacitor connected between two connection lines 4, as depicted in FIG. 1A, and is connected in parallel to the chamber 1. Noting that the chamber 1 functions as a coil, the circuit configuration of the plasma generation apparatus A1 is represented by an equivalent circuit diagram shown in FIG. 1B. In FIG. 1B, the capacitor shown in a broken line (capacitance $C_{gap}$) corresponds to the insulating gap 11a capable of functioning as a capacitor. In the illustrated embodiment, the capacitance of the insulating gap 11a is very small (e.g., about one several-hundredths of the parallel capacitor 6) and can be negligible as compared to the capacitance of the parallel capacitor 6 in an application.

For instance, letting the self-inductance of the chamber 1 be L and the angular frequency of the high-frequency current flowing in the chamber 1 be ω, the capacitance $C_1$ of the parallel capacitor 6 is determined to satisfy the following equation (1).

$$C_1 = 1/(\omega^2 L) \quad (1)$$

That is, the combined impedance Z of the chamber 1 and the parallel capacitor 6 is calculated by the following equation (2). The above equation (1) is derived as the condition for maximizing the impedance Z.

$$Z = 1/\{(1/j\omega L) + j\omega C_1\} \quad (2)$$
$$= j\omega L/(1 - \omega^2 L C_1)$$

Accordingly, the chamber 1 and the parallel capacitor 6 form a parallel resonance circuit. Practically, however, designing an ideal parallel resonance circuit will may result in an unduly high output voltage from the high-frequency power source 3. Hence, in view of the withstanding voltages of the respective circuit components constituting the high-frequency power source 3, the capacitance $C_1$ of the parallel capacitor 6 may be slightly offset from the value determined by the above equation (1).

In the above instance, the capacitance $C_{gap}$ of the insulating gap 11a is not taken into consideration. Alternatively, the following equation (3) represents capacitance $C_1$ of the parallel capacitor 6 determined when the capacitance $C_{gap}$ is considered.

$$C_1 = 1/(\omega^2 L) - C_{gap} \quad (3)$$

Though not shown, the plasma generation apparatus A1 may further include sensors for detecting the current and power of the plasma inside the main body 11 of the chamber 1, and sensors for detecting the light emitted from the plasma. The high-frequency power source 3 may control its output in accordance with the detection results from these sensors.

In an embodiment, an impedance matching device may be provided on the output side of the high-frequency power source 3 so as to adjust the impedance of the entire load viewed from the high-frequency power source 3 to a desired impedance. In this case, the impedance adjustment device may be controlled so as not to operate at the time of plasma ignition, and to operate after the plasma ignition.

Next, a method for generating a plasma will be described.

A material gas is introduced into the main body 11 of the chamber 1 through the inlet port 12. In the illustrated embodiment, without limitation, the material gas is phosphorous gas. Any other suitable kind of gas may be used for the material gas.

The magnetic flux that passes through the inside of each magnetic core 2 changes due to the high-frequency current flowing in the toroidal direction in the main body 11 of the chamber 1. Due to the change in the magnetic flux in the magnetic cores 2, a high-frequency electric field in the toroidal direction is generated in the electric discharge space inside the main body 11 of the chamber 1. Due to this electric field, the material gas inside the main body 11 becomes a plasma toroidally contained in the space, and a plasma current flows in the toroidal direction in the electric discharge space inside the main body 11 of the chamber 1.

For example, in the cross section of the left side of the main body 11 of the chamber 1 shown in FIG. 4, when the current flows in the main body 11 toward the paper surface, counterclockwise main magnetic flux (see the bold-lined arrows shown in FIG. 4) is generated inside the magnetic core 2. Then, in the electric discharge space inside the main body 11, an inverse electromotive force to cancel out the main magnetic flux is induced by electromagnetic induction, and an electric field that extends away from the paper surface is generated. At this stage, in the cross section of the right side of the main body 11 of the chamber 1 shown in FIG. 4, a current flows away from the paper surface in the main body 11. As a result, clockwise main magnetic flux (see the bold arrow shown in FIG. 4) is generated inside the magnetic core 2, and an electric field moving toward the paper surface is generated in the electric discharge space inside the main body 11. In this manner, a high-frequency electric field in the toroidal direction is generated in the electric discharge space inside the main body 11 of the chamber 1.

The material gas that has become a plasma is discharged as a reactive gas through the outlet port 13.

Next, effects and advantages of the plasma generation apparatus A1 according to the present embodiment will be described.

According to the present embodiment, the parallel capacitor 6 is connected in parallel to the chamber 1, and the chamber 1 and the parallel capacitor 6 form a parallel resonance circuit. Accordingly, the impedance Z of the load viewed from the high-frequency power source 3 is high. The high impedance Z makes it possible to apply high voltage to the chamber 1 even if the output power of the high-frequency power source 3 is low. As a result, the chamber 1 can generate a sufficient high-frequency magnetic field, and can thereby generate a sufficient high-frequency electric field inside the main body 11 of the chamber 1. Hence, a sufficient high-frequency electric field necessary for plasma ignition can be generated at low electric power. Accordingly, the high-frequency power source 3 does not need to output high electric power. It also eliminates the need to separately provide an ultraviolet irradiator or an electrode for applying high-voltage pulses. Note that even if the capacitance $C_1$ of the parallel capacitor 6 is slightly offset from the resonance condition described above, the same advantages can be achieved since the impedance Z of the load viewed from the high-frequency power source 3 is high enough.

According to the present embodiment, the high-frequency current outputted by the high-frequency power source 3 flows in the toroidal direction in the main body 11 of the chamber 1, and the plasma current flows in the toroidal direction in the electric discharge space inside the main body 11 of the chamber 1. That is, the route in which the plasma current flows is located inside the route in which the high-frequency current (excitation current) flows, these two routes are close to each other, and the central axes of the two routes are substantially the same. As shown in FIG. 4, magnetic flux leakage (see thin arrows) occurs only in a plasma sheath between the inner wall 11c of the main body 11 of the chamber 1 and toroidal plasma P. Since the plasma sheath is a narrow region with high magnetic resistance, magnetic flux leakage barely occurs. This makes it possible to reduce magnetic flux leakage and strengthen coupling. As a result, the power outputted by the high-frequency power source 3 can be used effectively. Also, since no inductive coil for changing the magnetic flux is needed, the installation space for the inductive coil can be omitted, and the plasma generation apparatus A1 can be made smaller. Also, the manufacturing cost can be reduced.

Also, in the present embodiment, the magnetic cores 2 are provided, and the magnetic flux passes through the magnetic cores 2 which have small magnetic resistance. This makes it possible to decrease the excitation current needed for generating the same magnetic flux. Accordingly, the high-frequency current outputted from the high-frequency power source 3 can be suppressed. Also, since the current that flows in the main body 11 of the chamber 1 can be reduced, heat generated in the chamber 1 can be suppressed.

In the first embodiment described above, four magnetic cores 2 are provided. However, there is no limitation thereto, and the number of magnetic cores 2 may be determined as appropriate according to the sectional area of the magnetic cores 2. Also, if the high-frequency power source 3 outputs a high-frequency current, the magnetic cores 2 may not need to be provided. In this variation as well, when the high-frequency current flows in the toroidal direction through the main body 11 of the chamber 1, the magnetic flux that passes through the opening 11e of the main body 11 changes. As a result, a high-frequency electric field in the toroidal direction is generated and toroidal plasma is generated in the electric discharge space inside the main body 11 of the chamber 1. In addition, since the parallel capacitor 6 is provided, the impedance Z of the load viewed from the high-frequency power source 3 is high. Accordingly, the present variation also achieves a similar effect to that of the first embodiment. Also, in the present variation, there is no need to provide the magnetic cores 2. This makes it possible to further downsize the plasma generation apparatus A1 to reduce the manufacturing cost.

Figure 5:
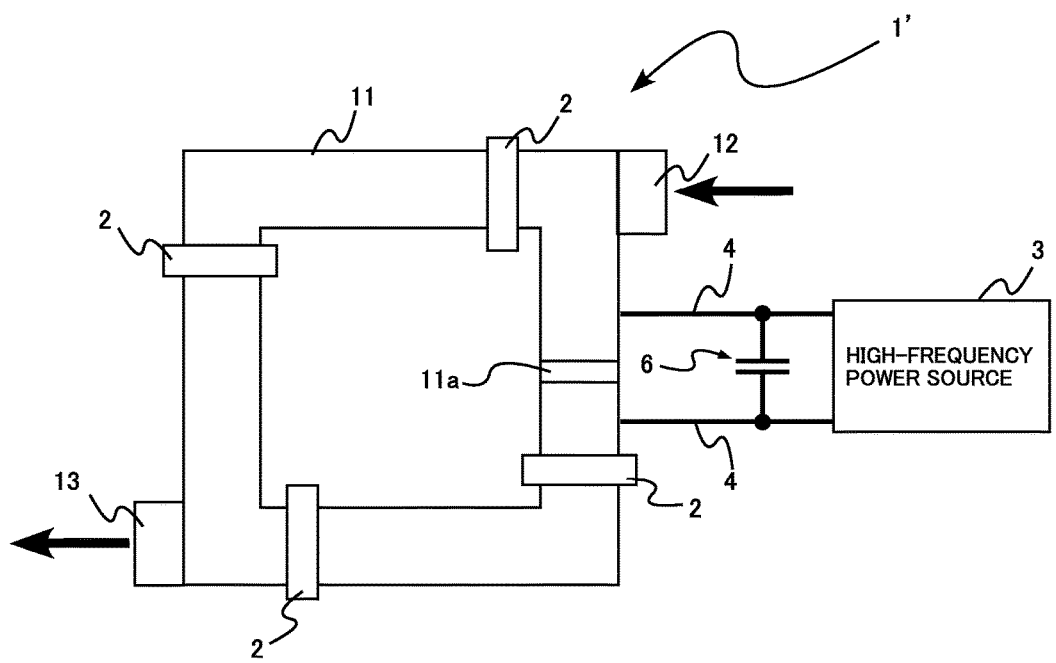
FIG. 5 illustrates a modified example of the chamber.

In the above first embodiment, the main body 11 of the chamber 1 has an oval toroidal shape, but there is no limitation thereto. For example, the main body 11 may have a circular or elliptical toroidal shape. Also, it is possible to employ a quadrangular ring shape, as with the chamber 1' shown in FIG. 5, or to employ a substantially quadrangular ring shape obtained by rounding the corners of the quadrangular ring shape. It is also possible to use another polygonal ring shape. Even in these cases, the toroidal plasma can still be generated in the electric discharge space inside the main body 11. In addition, since the parallel capacitor 6 is provided, the impedance Z of the load viewed from the high-frequency power source 3 is high. Accordingly, the present variation also achieves a similar effect to that of the first embodiment.

In the case of the plasma generation apparatus A1 according to the first embodiment, the material gas introduced through the inlet port 12 is divided into two parts, passes through the electric discharge space inside the main body 11, and is discharged from the outlet port 13. In the vicinity of the insulating gap 11a, a high-frequency electric field is generated due to a potential difference, and electric field coupling also occurs. This makes it easy to generate a plasma. Accordingly, the degree to which the material gas becomes a plasma differs between the case of passing through the insulating gap 11a (route on the right side of the main body 11 shown in FIG. 1A) and the case of not passing through the insulating gap 11a (route on the left side of the main body 11 shown in FIG. 1A), and the reactive gas that is discharged becomes uneven in properties. A case of suppressing this unevenness will be described below as a second embodiment.

Figure 6A:
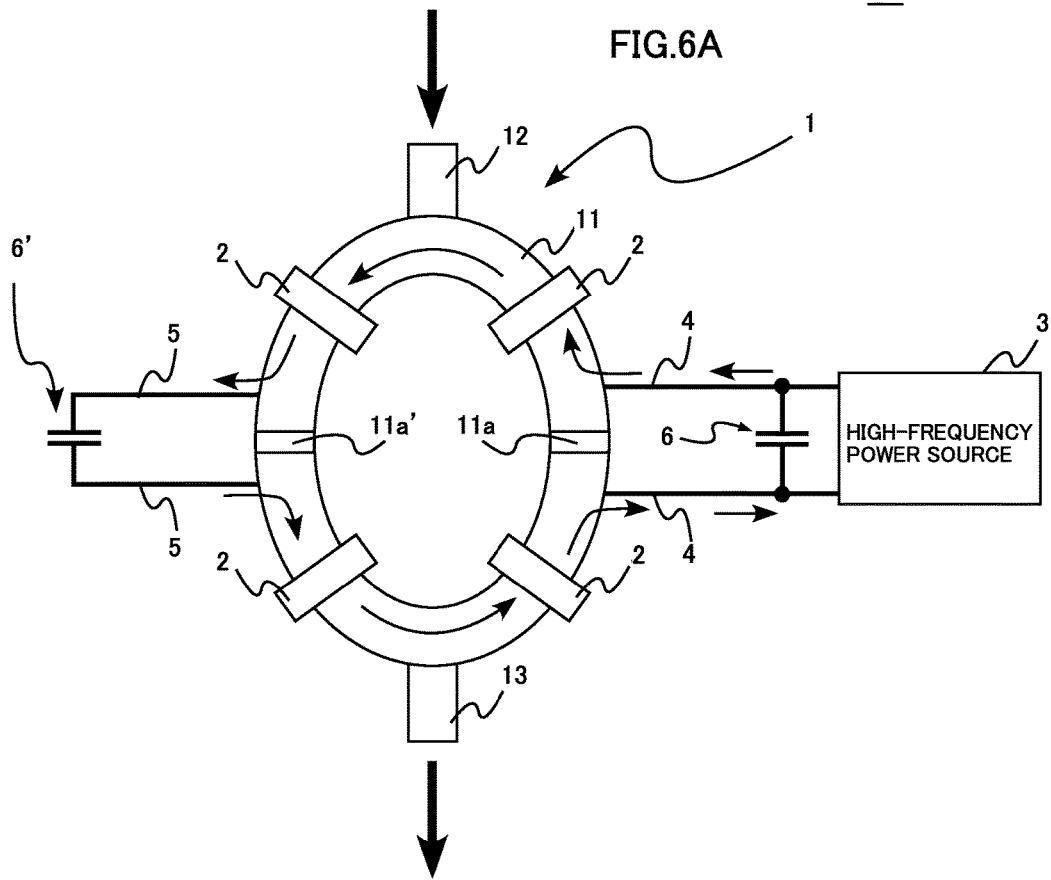
FIG. 6A is a schematic diagram illustrating a plasma generation apparatus according to a second embodiment.
Figure 6B:
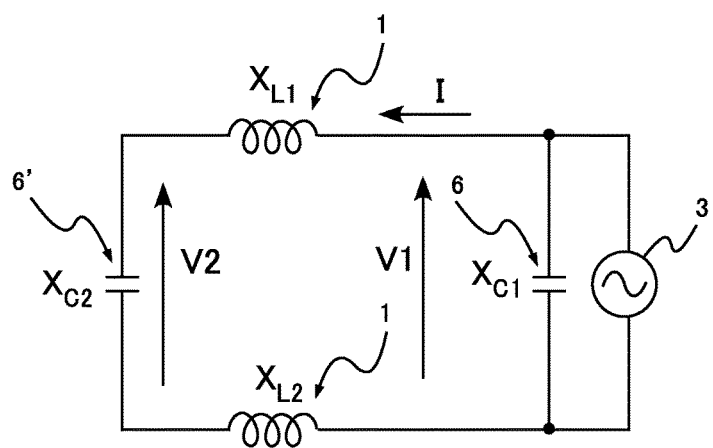
FIG. 6B is an equivalent circuit diagram of the plasma generation apparatus of the second embodiment.

FIGS. 6A and 6B illustrate a plasma generation apparatus according to the second embodiment. FIG. 6A is a schematic diagram showing the entirety of the plasma generation apparatus according to the second embodiment. In FIG. 6A, elements that are the same as or similar to those of the plasma generation apparatus A1 (see FIG. 1A) are denoted by the same reference signs. As shown in FIG. 6A, the plasma generation apparatus A2 differs from the plasma generation apparatus A1 in that an additional insulating gap 11a' is provided in the main body 11 of the chamber 1 and a series capacitor 6' is connected to the main body 11 of the chamber 1 at both sides of the insulating gap 11a'. In other words, the capacitor 6' are connected in series to the main body 11 of the chamber 1 in a manner such that the capacitor 6' bridges the additional insulating gap 11a'.

The insulating gap 11a' is for electrically insulating the main body 11 of the chamber 1, similarly to the insulating gap 11a. The additional or second insulating gap 11a' may be arranged at an opposing position to the first insulating gap 11a in the main body 11 of the chamber 1. The structure of the periphery of the insulating gap 11a' is also similar to that of the insulating gap 11a (see FIGS. 3A and 3B).

The series capacitor 6' is a capacitor with a reactance that is about one half of the reactance of the chamber 1 in the state after plasma has been generated. The series capacitor 6' is connected to the main body 11 of the chamber 1 by connection lines 5 on both sides of the insulating gap 11a'. In this way, the high-frequency current outputted from the high-frequency power source 3 flows in the electric current route (thin arrows shown in FIG. 6A) formed by the connection line 4, half of the main body 11 of the chamber 1, the connection line 5, the series capacitor 6', the connection line 5, half of the main body 11 of the chamber 1, and the connection line 4.

FIG. 6B shows an equivalent circuit of the plasma generation apparatus A2.

Let $X_L$ be the reactance of the chamber 1 in the state after plasma has been generated, $X_{C1}$ be the reactance of the parallel capacitor 6, and $X_{C2}$ be the reactance of the series capacitor 6'. Since the chamber 1 is divided into two portions by the insulating gaps 11a and 11a', FIG. 6B shows the reactance of one of the portions as $X_{L1}$ and the reactance of the other portion as $X_{L2}$. Here, the equation $X_{L1}+X_{L2}=X_L$ is satisfied. Since $X_{C2}=(\frac{1}{2})X_L$, the potential difference V1 between the two ends of the insulating gap 11a and the potential difference V2 between the two ends of the insulating gap 11a' are as defined by the following equations (4) and (5). Note that I denotes the current that flows in the main body 11 of the chamber 1.

$$V1 = j(X_L - X_{C2}) \times I = j(\tfrac{1}{2}) X_L \times I \tag{4}$$

$$V2 = -jX_{C2} \times I = -j(\tfrac{1}{2}) X_L \times I \tag{5}$$

As seen from the equations (4) and (5) above, $|V1|=|V2|$ is satisfied, and high-frequency electric fields of the same size are generated in the vicinity of the insulating gap 11a and in the vicinity of the insulating gap 11a'. Accordingly, electric field coupling similar to that in the vicinity of the insulating gap 11a occurs in the vicinity of the insulating gap 11a'.

Due to the series capacitor 6', the second embodiment differs from the first embodiment with respect to the resonance condition. Letting $C_2$ be the capacitance of the series capacitor 6', the impedance Z' of the combination of the chamber 1, the parallel capacitor 6, and the series capacitor 6' is obtained by the following equation (6). The following equation (7) is derived as a condition for maximizing the impedance Z'. The capacitance $C_1$ of the parallel capacitor 6 is set to satisfy the following equation (7).

$$Z = \cfrac{1}{\cfrac{1}{j\omega L + \cfrac{1}{j\omega C_2}} + j\omega C_2} = \cfrac{1}{j\omega} \cdot \cfrac{1 - \omega^2 L C_2}{C_2 - \omega^2 L C_1 C_2 + C_1} \tag{6}$$

$$C_1 = \cfrac{C_2}{\omega^2 L C_2 - 1} \tag{7}$$

The second embodiment can also achieve an effect similar to that of the first embodiment. Furthermore, in the second embodiment, because the electric field coupling that occurs in the vicinity of the insulating gap 11a and the electric field coupling that occurs in the vicinity of the insulating gap 11a' are substantially the same, the degree to which the material gas becomes a plasma is similar between the case of passing through the insulating gap 11a (route on the right side of the main body 11 shown in FIG. 6A) and the case of passing through the insulating gap 11a' (route on the left side of the main body 11 shown in FIG. 6A). This makes it possible to suppress a case in which the reactive gas to be discharged becomes uneven.

In the second embodiment, the insulating gap 11a and the insulating gap 11a' are positioned opposite to each other in the main body 11 of the chamber 1, but there is no limitation thereto. It is sufficient as long as the insulating gap 11a is provided intermediately on one of the two routes from the inlet port 12 to the outlet port 13 and the insulating gap 11a' is provided intermediately on the other of the two routes.

In the first and second embodiments above, the high-frequency magnetic field is generated by causing a high-frequency current to flow through the main body 11, but the present disclosure is not limited to this. A case of generating a high-frequency magnetic field by causing a high-frequency current to flow through an inductive coil wound around the magnetic core 2 will be described below as a third embodiment.

Figure 7:
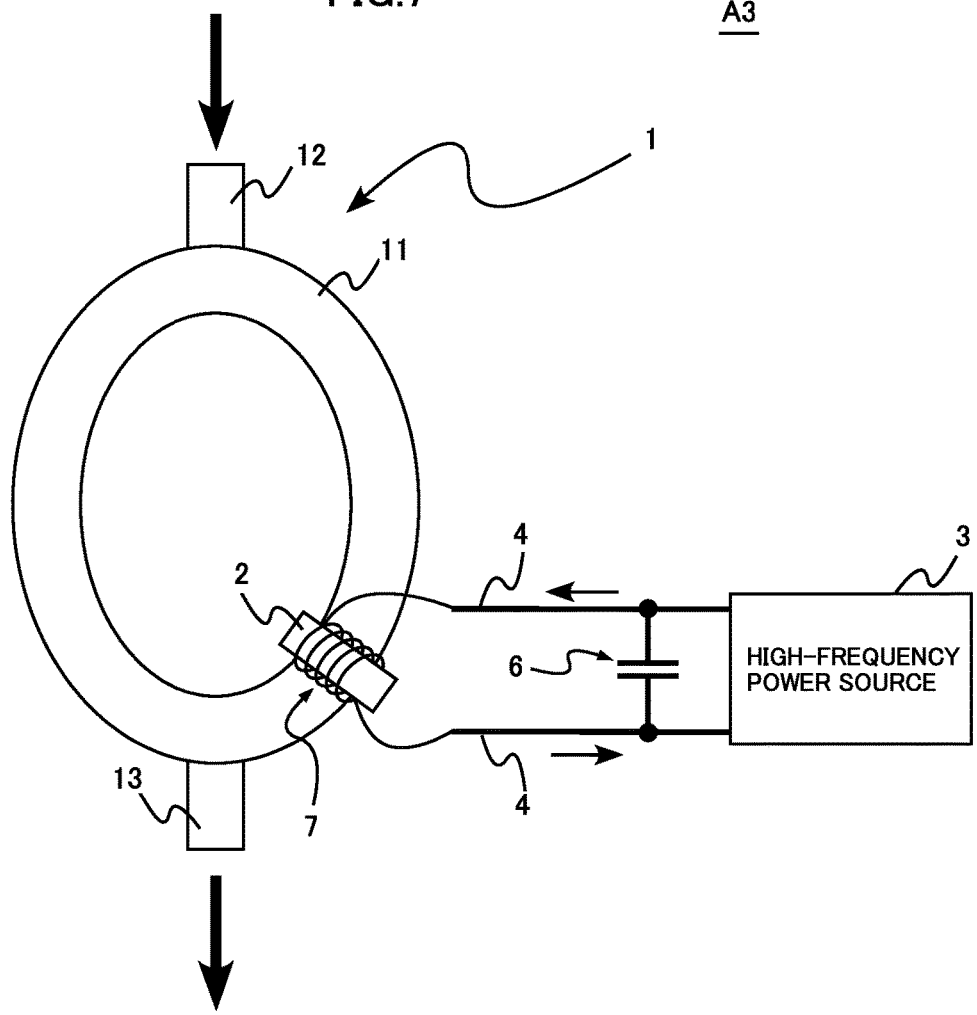
FIG. 7 is a schematic diagram illustrating a plasma generation apparatus according to a third embodiment.

FIG. 7 is a schematic diagram showing the entirety of a plasma generation apparatus according to the third embodiment. In FIG. 7, elements that are the same as or similar to those of the plasma generation apparatus A1 according to the first embodiment (see FIG. 1A) are denoted by the same reference signs. As shown in FIG. 7, the plasma generation apparatus A3 includes one magnetic core 2, and an inductive coil 7 wound around the magnetic core 2, and differs from the plasma generation apparatus A1 according to the first embodiment in that the connection lines 4 are connected to respective terminals of the inductive coil 7.

In the third embodiment, the high-frequency current outputted by the high-frequency power source 3 flows through the inductive coil 7. Accordingly, the magnetic flux that passes through the inside of the magnetic core 2 changes. Due to the change in the magnetic flux in the magnetic core 2, a high-frequency electric field in the toroidal direction is generated in the electric discharge space inside the main body 11 of the chamber 1. Due to this electric field, the material gas inside the main body 11 becomes plasma, toroidal plasma is generated, and a plasma current flows in the toroidal direction in the electric discharge space inside the main body 11 of the chamber 1.

According to the third embodiment, the parallel capacitor 6 is connected in parallel to the inductive coil 7, and the inductive coil 7 and the parallel capacitor 6 form a parallel resonance circuit. Accordingly, the impedance Z of the load viewed from the high-frequency power source 3 is high. The high impedance Z makes it possible to apply high voltage to the inductive coil 7 even if the output power of the high-frequency power source 3 is low. As a result, the inductive coil 7 can generate a sufficient high-frequency magnetic field, and can thereby generate a sufficient high-frequency electric field inside the main body 11 of the chamber 1. That is, a sufficient high-frequency electric field necessary for plasma ignition can be generated at low electric power.

Unlike the first and second embodiments, it is not necessary in the third embodiment to cause a current to flow in the chamber 1, and therefore the chamber 1 may not be made of an electroconductive material. Furthermore, the main body 11 of the chamber 1 does not need to include the insulating gap 11a. On the other hand, if the chamber 1 is made of an electroconductive material such as a metal, it is preferable to provide an insulating gap similar to the insulating gap 11a shown in FIGS. 1A and 1B so as to prevent an inductive current in the toroidal direction from flowing in the outer wall surface of the main body 11 of the chamber 1.

In the first to third embodiments above, the parallel capacitor 6 is connected between the two connection lines 4, but the present disclosure is not limited to this. For example, the parallel capacitor 6 may be arranged inside the high-frequency power source 3, or may be arranged between the two flanges 11d sandwiching the insulating gap 11a of the chamber 1.

Figure 8:
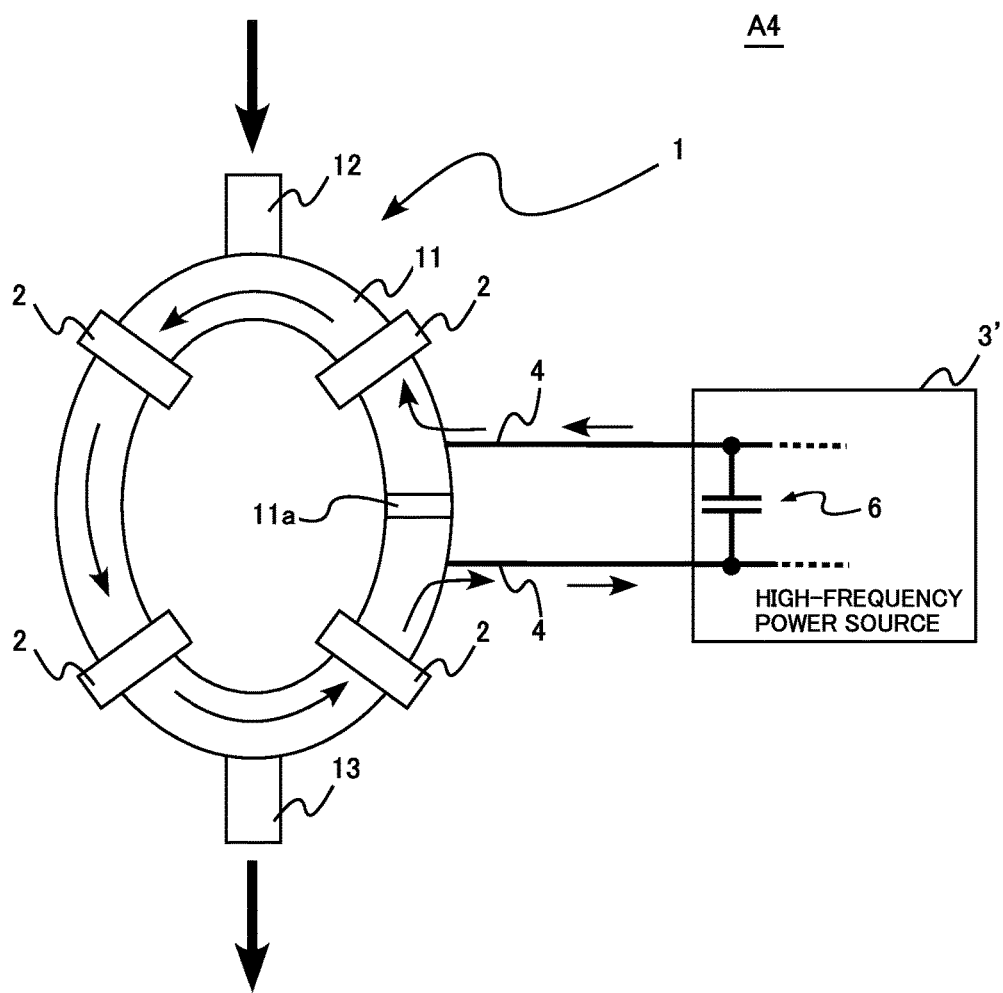
FIG. 8 is a schematic diagram illustrating a plasma generation apparatus according to a fourth embodiment.

FIG. 8 is a schematic diagram illustrating a plasma generation apparatus according to the fourth embodiment. In FIG. 8, elements that are the same as or similar to those of the plasma generation apparatus A1 of the first embodiment (FIG. 1A) are denoted by the same reference signs. As shown in FIG. 8, the plasma generation apparatus A4 differs from the plasma generation apparatus A1 in that the parallel capacitor 6 is arranged inside a high-frequency power source 3'. In other words, for example, the parallel capacitor 6 may be disposed within an outer case or housing of the high-frequency power source 3'.

The high-frequency power source 3' includes the parallel capacitor 6 connected in parallel between two inner portions of output terminals. Specifically, one lead of the capacitor 6 is connected to one of the two inner portions, and the other lead to the other one of the two inner portions. The capacitance of the parallel capacitor 6 is set to satisfy the above equation (1) based on the self-inductance of the chamber 1, similarly to the first embodiment. The fourth embodiment also achieves the advantageous effects similar to those of the first embodiment. In addition, since the parallel capacitor 6 is provided inside the high-frequency power source 3', the user can simply connect the chamber 1 to the output terminals of the high-frequency power source 3' (via the connection lines 4, for example) without needing to pay a particular attention to the connection of the parallel capacitor 6 to the chamber 1.

The plasma generation apparatus and the high-frequency power source according to the present disclosure are not limited to the above-described embodiments. Specific configurations of the components of the plasma generation apparatus and the high-frequency power source of the present disclosure may be modified in various ways.

The invention claimed is:

1. A plasma generation apparatus comprising:
a chamber having a toroidal-shaped electric discharge space;
a high-frequency power source that outputs a high-frequency current;
a magnetic field generator that generates a high-frequency magnetic field upon flowing of the high-frequency current therethrough; and
a parallel capacitor connected in parallel to the magnetic field generator,
wherein the chamber is made of an electroconductive material, and the chamber comprises an insulating portion that provides the chamber with insulation in a toroidal direction,
the insulating portion comprises a gap, and the chamber comprises a first end and a second end that face each other via the gap,
the insulating portion further comprises a tubular connection adapter, wherein the chamber is formed with two flanges spaced apart from each other with the connection adapter intervening therebetween, and the connection adapter is disposed between the two flanges for defining a size of the gap in the toroidal direction.

2. The plasma generation apparatus according to claim 1, wherein the parallel capacitor has a capacitance that is set based on a self-inductance of the magnetic field generator.

3. The plasma generation apparatus according to claim 2, wherein the capacitance of the parallel capacitor is equal to $1/(\omega^2 L)$, where L is the self-inductance of the magnetic field generator and w is an angular frequency of the high-frequency current.

4. The plasma generation apparatus according to claim 1, wherein the parallel capacitor is disposed between the high-frequency power source and the magnetic field generator.

5. The plasma generation apparatus according to claim 1, wherein the parallel capacitor is disposed inside the high-frequency power source.

6. The plasma generation apparatus according to claim 1, wherein the chamber functions as the magnetic field generator.

7. The plasma generation apparatus according to claim 1, wherein the chamber is made of a metal.

8. The plasma generation apparatus according to claim 6, further comprising a series capacitor, wherein the chamber comprises an additional insulating portion that provides the chamber with insulation in the toroidal direction, and the series capacitor is connected to the chamber in a manner such that the series capacitor bridges the additional insulating portion.

9. The plasma generation apparatus according to claim 8, wherein the series capacitor has a reactance that is substantially one half of a reactance of the magnetic field generator after generation of plasma.

10. The plasma generation apparatus according to claim 1, further comprising an elastic ring held in close contact with an inner surface of the connection adapter and an outer surface of the chamber.

11. The plasma generation apparatus according to claim 1, further comprising a magnetic core that surrounds a tubular portion of the chamber.

12. The plasma generation apparatus according to claim 11, wherein the magnetic field generator comprises an inductive coil wound around the magnetic core.

* * * * *